United States Patent [19]

Seale

[11] Patent Number: 5,291,152
[45] Date of Patent: Mar. 1, 1994

[54] PROXIMITY SWITCH HAVING OSCILLATOR INDUCTIVELY COUPLED THROUGH PULSED FARADAY SHIELD TO RESONANT TARGET

[75] Inventor: Allen G. Seale, Surrey, United Kingdom

[73] Assignee: Vaseal Electronics Limited, Christchurch, United Kingdom

[21] Appl. No.: 969,312

[22] PCT Filed: Aug. 15, 1991

[86] PCT No.: PCT/GB91/01387
§ 371 Date: Feb. 16, 1993
§ 102(e) Date: Feb. 16, 1993

[87] PCT Pub. No.: WO92/03876
PCT Pub. Date: Mar. 5, 1992

[30] Foreign Application Priority Data

Aug. 15, 1990 [GB] United Kingdom ............... 9017910

[51] Int. Cl.⁵ ................. H03K 17/95; G06K 7/08
[52] U.S. Cl. .................. 331/65; 324/207.16; 324/236; 331/67; 331/74; 336/75; 336/115; 336/200; 340/552
[58] Field of Search ......... 331/65, 67, 74, 75; 324/207.16, 236; 336/75, 115, 200; 340/552

[56] References Cited

U.S. PATENT DOCUMENTS

| 4,101,791 | 7/1978 | Atkins et al. ............... 331/65 X |
| 4,425,511 | 1/1984 | Brosh ........................... 307/106 |
| 5,068,612 | 11/1991 | Auslander et al. ........ 324/236 X |

FOREIGN PATENT DOCUMENTS

| 0111693 | 6/1984 | European Pat. Off. . |
| 0229247 | 7/1987 | European Pat. Off. . |
| 2739967 | 3/1979 | Fed. Rep. of Germany . |
| 3511666A1 | 10/1986 | Fed. Rep. of Germany . |
| 3600896A1 | 7/1987 | Fed. Rep. of Germany . |
| 2331849 | 6/1977 | France . |

Primary Examiner—Siegfried H. Grimm
Attorney, Agent, or Firm—Nixon & Vanderhye

[57] ABSTRACT

An inductive type proximity switch (S) includes an open-ended loop (L3) adjacent to the inductor (L1, L2) of the parallel resonant circuit of its main (LC) oscillator. A high speed bistate switch (S1) is connected between the ends of the loop (L3). A pulsed input to the switch (S1) causes sequential making and breaking of a connection between the ends of the loop (L3) whereby the loop (L3) functions as a Faraday shield to inhibit mutual inductive linking of the inductor (L1, L2) with an inductor (L4) of a passive (LC) resonant circuit (L4, C4) of a target (T) when the target (T) is in proximity with the proximity switch (S) and the connection between the ends of the loop (L3) is made by the bistate switch (S1).

16 Claims, 5 Drawing Sheets

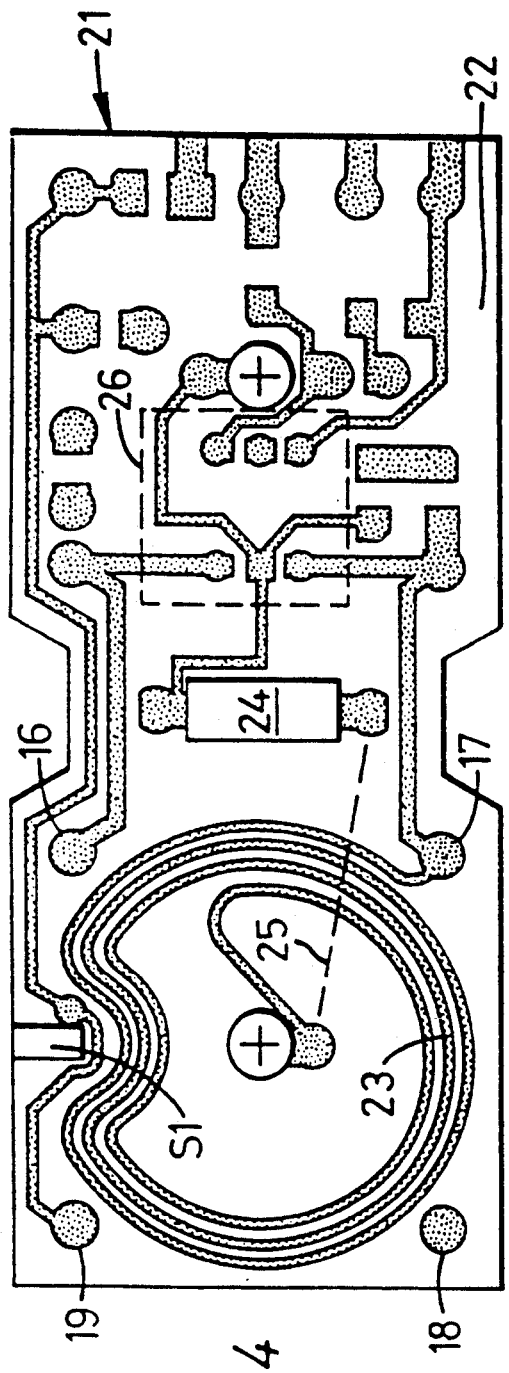
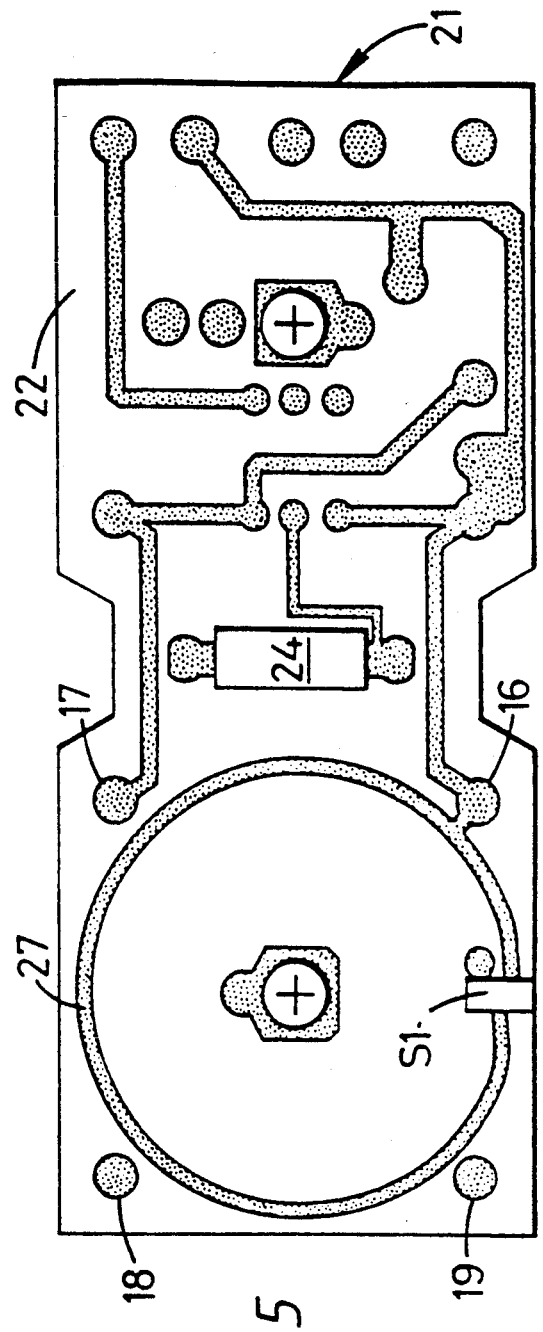
Fig. 4
Fig. 5

PROXIMITY SWITCH HAVING OSCILLATOR INDUCTIVELY COUPLED THROUGH PULSED FARADAY SHIELD TO RESONANT TARGET

DESCRIPTION

This invention relates to inductive type proximity switches or detectors; to a combination of such a proximity switch and a target, and to a target for use in such a combination.

Such inductive type proximity switches or detectors normally comprise a main LC oscillator circuit, the inductance of which is influenced by a metal object or target, which may be a passive LC resonant circuit, such that when the target enters the high frequency field of the main oscillator, either the coupling or the critical resonant frequency of the main oscillator is altered resulting in a voltage change in the main oscillator circuit. Removal of the metal object or target from the high frequency field of the main oscillator causes the main oscillator voltage to revert to normal.

When the main oscillator voltage varies outside a predetermined level in response to the proximity of the target, a threshold detector senses the voltage change and causes actuation of a bistate device such as a field effect transistor switch. Generally, although not necessarily the oscillator and threshold detector will be incorporated in the same integrated circuit device. When the target is moved away from the main oscillator its voltage will be restored to its quiescent value and in consequence will revert the threshold switch to its normal state. Thus, the restoration of the bistate device to the normal state indicates that the target is not in the proximity of the main oscillator and this feature is used in machinery to protect personnel by providing an indication of the presence or absence of a target at a certain location.

Should a fault occur in the main oscillator circuit whilst it is influenced by the proximity of the target, the bistate device may not be restored to its normal state when the target is removed from the proximity of the main oscillator circuit. Thus any interlock system of which the proximity switch is a part will not function and would not be 'fail safe'. In addition, or alternatively, in some applications it is desirable to provide for handshaking between the proximity switch and the target.

According to one aspect of this invention there is provided a combination as claimed in claim 1. Preferred features of such a combination provided with handshaking means are claimed in claims 9 to 12.

According to a second aspect of this invention there is provided a proximity switch as claimed in claim 3.

If the inductance means of the main LC oscillator comprises a coil of a parallel resonant circuit and a feedback coil and if they are wound on a former, it has been found necessary for the open loop to be in open ended coil of several turns and for it to be wound around the feedback coil. That presented problems of quality control and the resultant proximity switch was unable to differentiate approach of a target to the end of the former that was near to the open ended coil from approach of a target to the former from some other direction.

Preferred features of a proximity switch according to the second aspect of this invention are claimed in claims 3 to 8. Such use of a stack of printed circuit boards is not only simpler to manufacture using well known printed circuit techniques, but it has the added advantage of enabling approach of a target to one end of the stack to be distinguished from approach of the target from some other direction.

According to a third aspect of this invention there is provided a target for use in combination with an inductive type proximity switch as claimed in claim 13. Preferred features of a target according to the third aspect of this invention are claimed in claims 14 and 15.

Three embodiments of this invention will be described now by way of example with reference to the accompanying drawings, of which:

FIG. 4 is a plan view of the second of the stack of boards of the proximity switch including the board shown in FIGS. 2 and 3;

FIG. 5 is an underneath plan of the board shown in FIG. 4;

Figure 1:
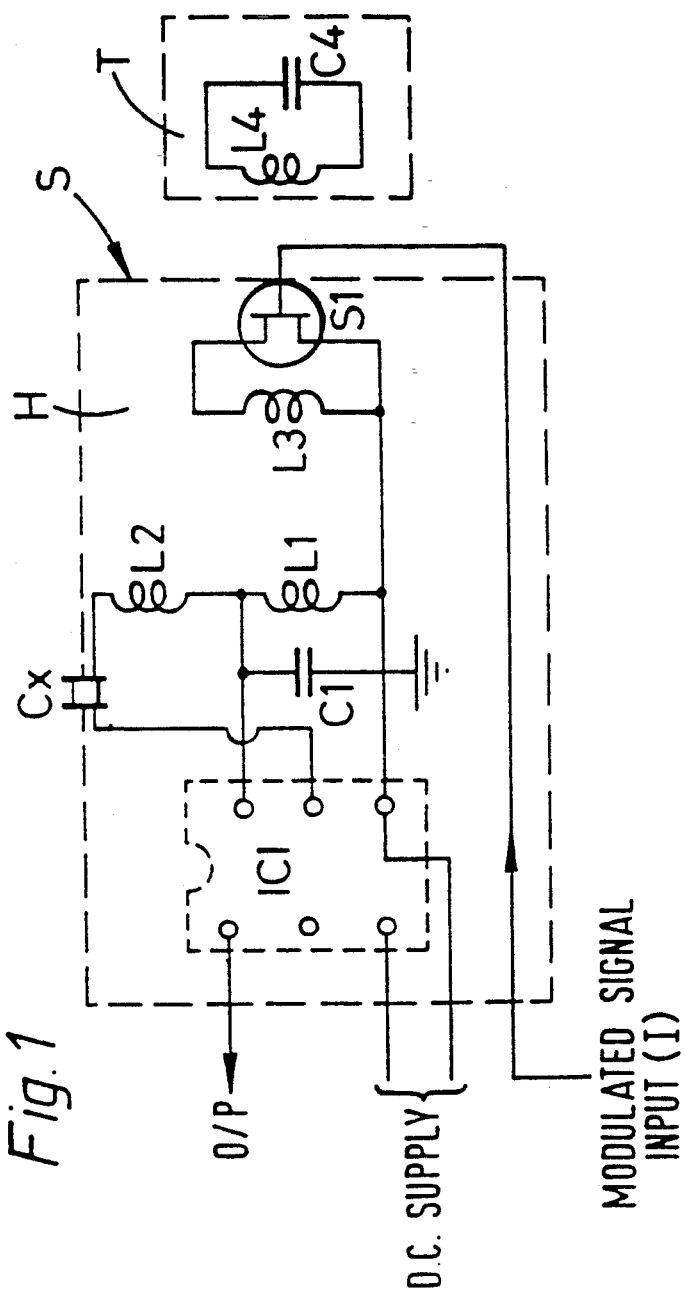
FIG. 1 is a circuit diagram of a proximity switch and associated target.
Figure 2:
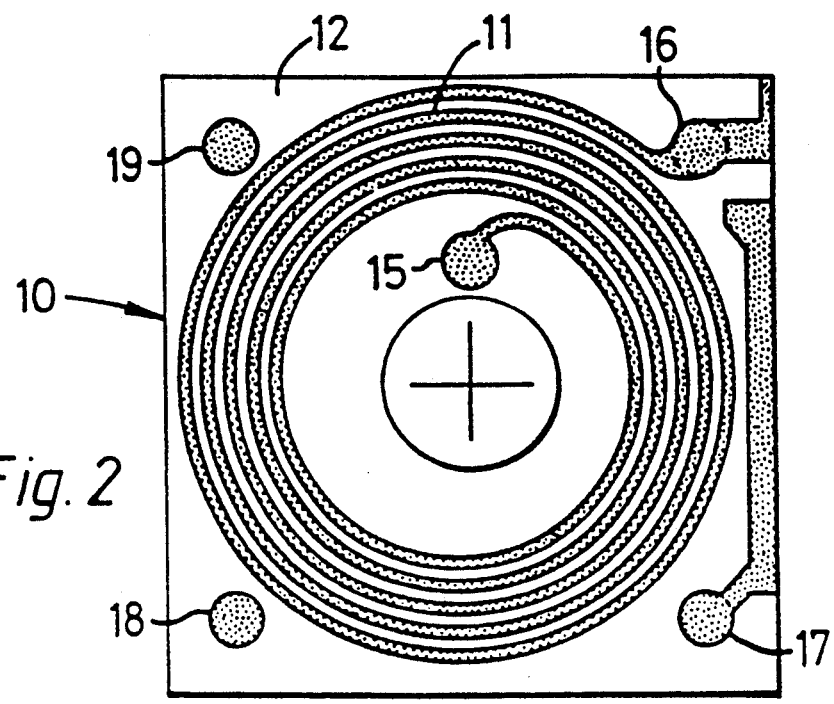
FIG. 2 is plan view of one of a stack of two circuit boards which comprise a proximity switch in which this invention is embodied.
Figure 3:
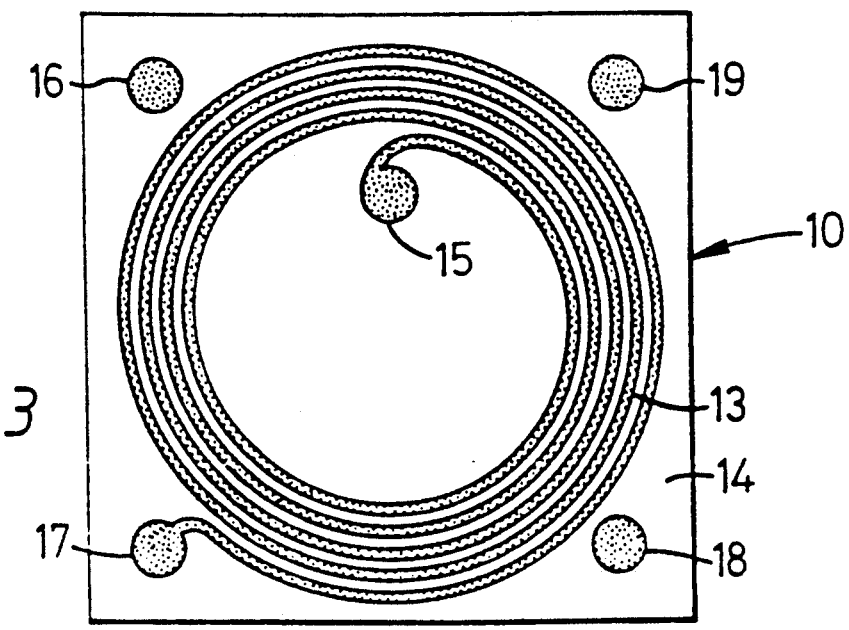
FIG. 3 is an underneath plan of the circuit board shown in FIG. 2.

FIG. 1 shows a proximity switch 5 incorporates a main oscillator circuit which is a Tickler-Coil Feedback Oscillator and which comprises an earthed parallel resonant circuit comprising an inductance L1 in parallel with a capacitor C1, a feedback coil L2 connected in series with the parallel resonant circuit and a control circuit including a crystal resonator Cx and an integrated circuit IC1. A loop L3 of electrically conductive material having two spaced ends, is also formed within the encapsulated housing H, adjacent the feedback coil L2 which in turn is adjacent the inductance L1 and which, in practice, is located between the inductance L1 and the loop L3. A high speed bistable switch, such as a MOSFET S1, is mounted within the housing H and is arranged to be actuated by a pulsed input I to periodically make and break a connection between the ends of the loop L3.

A target T incorporating a passive resonant parallel circuit L4, C4 is shown positioned adjacent the loop L3 where it lowers the critical resonant frequency of the main oscillator circuit. The pulsed input I to the MOSFET S1 effects rapid switching on and off with the result that the loop L3 is periodically made and broken. When made it functions as a Faraday shield to inhibit inductive linking of the target inductance L4 with the inductances L1 and L2 of the main oscillator. Hence the voltage of the main oscillator is lowered and raised periodically and rapidly in response to the modulating signal I at the gate of the MOSFET S1. Thus, should a fault occur in the oscillator circuit of the proximity switch S whilst the target T is in the proximity of it and the target T then be removed, the output signal from the IC1 will cease to be modulated and this will be detected by the logic system to which the switch is connected.

Referring to FIGS. 2 to 5, a printed circuit board 10, which conveniently is square, has one pancake coil 11 formed on one surface 12 and another pancake coil 13 formed on its other surface 14. The two coils 11 and 13 are inter-connected through a plated hole 15 in the board 10 so that together they comprise the inductance coil L1 of a main LC oscillator which is formed on the board 10. They are arranged so that the direction of current flow through the two parts 11 and 13 of the inductance coil L1, relative to the board 10, is the same. The capacitor C1 (not shown) of that main LC oscillator is mounted on the board 10.

Four pins 16 to 19 of electrically conductive material are mounted on the board 10, each in the region of a respective one of the corners of the board 10 so as to project from the surface 14. The pancake coil 11 is connected to the pin 16 which is to be earthed. The pancake coil 13 is connected to the pin 17. The pins 16 to 19 connect the board 10 to another board 21 which conveniently is rectangular with the length of its shorter sides being substantially the same as the length of a side of the square board 10. The two boards 10 and 21 are stacked one upon the other with the planar surface 14 of the board 10 facing a planar surface 22 of the board 21 which projects beyond the board 10 to one side, the other three sides of the board 10 being in substantial alignment with respective sides of the board 21.

A third pancake coil 23 is formed on that part of the surface 22 that has pins 16 to 19 at its corners. It serves as the feedback coil L2 of the main LC oscillator. It is connected to the pin 17 and it is arranged so that the direction of current flow through it, relative to the boards 10 and 21, is the same as for the other two coils 11 and 13. The other end of the third coil 23 is connected to one terminal of a ceramic crystal resonator 24 by a conductor 25 which is insulated with respect to the turns of the coil 23 over which it passes. The other terminal of the ceramic resonator 24, which is mounted in a slot in the projecting part of the board 21, is connected to an input of an integrated circuit 26 which is part of a signal processing circuit of the control circuit which is formed on both sides of the projecting part of the board 21.

An open loop 27 of conductive strip material is formed on that part of the opposite surface 28 of the board 21 that has the pins 16 to 19 at its four corners and serves as the loop L3. It is substantially coaxial with the third coil 23 and its diameter is substantially the same as the largest diameter of the coil 23. The MOSFET switch S1, which is mounted in a slot in the board 21, is connected between the ends of the loop 27 and is arranged to be actuated by the pulsed input signal I from a suitable source (not shown) to periodically open and close the loop.

In use the boards 10 and 21 would be encapsulated within a switch housing with the surface 28 outermost so that the target T would be presented to it.

Figure 6:
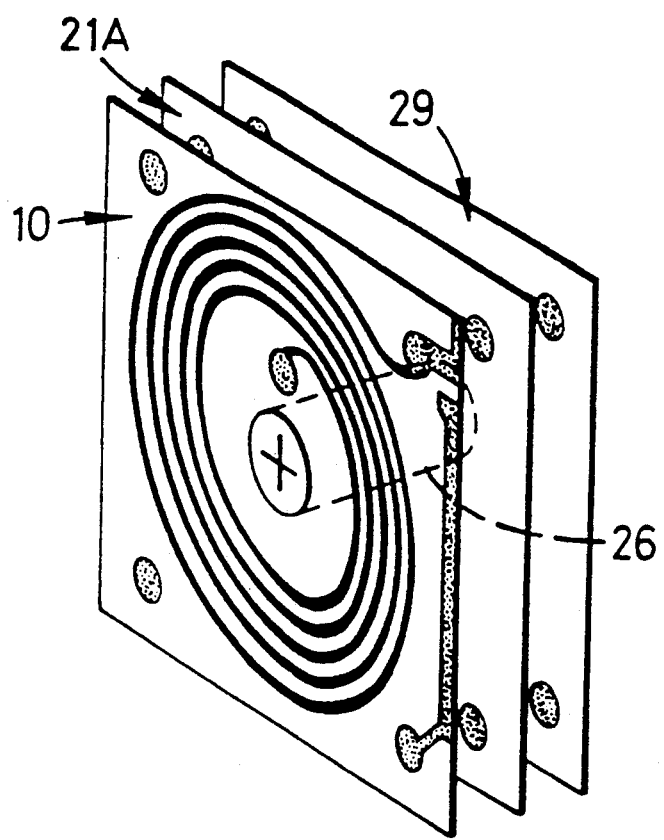
FIG. 6 is a view in perspective of another arrangement of stacked printed circuit boards for use in a proximity switch in which this invention is embodied.

The portion of the board 21 in which the slot accomodating the resonator 24 is formed is waisted. In the alternative embodiment shown in FIG. 6, it is separated into two boards 21A and 29 by cutting away the waisted position.

In this arrangement, the proximity switch comprises a stack of three square printed circuit boards 10, 21A and 29, the board 21A having the third coil 23 and the open loop 27 formed on it and carrying the MOSFET S1, the third board 29 having the control circuit including the integrated circuit 26 formed on it, and the three boards being linked together by the ceramic crystal resonator 24 which is fitted into holes in the centre of each board 10, 21A and 29.

If desired, the open loop L3 with the MOSFET S1 connected between its ends could be mounted in a special target rather than in the proximity switch as described above.

The invention can be applied to a handshaking arrangement for an inductive type proximity switch and its associated target.

Figure 7:
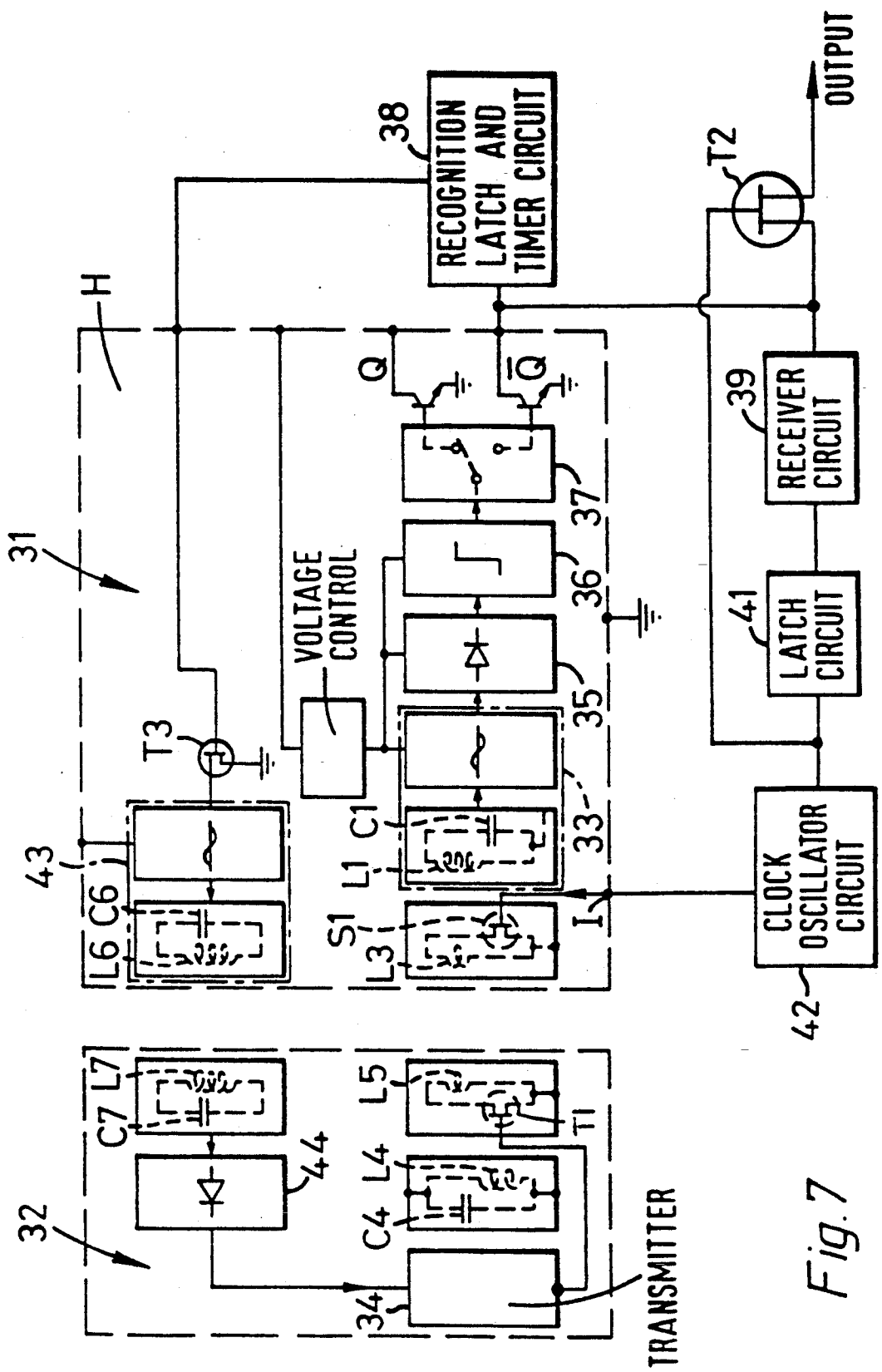
FIG. 7 is a circuit diagram of a proximity switch and an associated target which are provided with a handshaking arrangement.

FIG. 7 is a circuit diagram of a proximity switch 31 and its associated target 32 provided with such a handshaking arrangement. Those parts of the proximity switch 31 and the target 32 that correspond to similar parts of the proximity switch S and target T described with reference to FIG. 1 are identified by the same reference characters.

The target 32 is provided with another loop L5 of electrically conductive material having two spaced ends, the loop L5 being positioned within the body of the target 32 such that it will be between the passive resonant parallel circuit L4, C4 of the target 32 and the earthed parallel resonant circuit of the main LC oscillator circuit 33 of the proximity switch 31 when they are in proximity with one another.

A transistor T1, which is a bistable switch, is mounted within the body of the target 32 and is arranged to be actuated by a pulsed input to periodically make and break a connection between the ends of the loop L5. The pulsed input to the loop L5 effects sequential switching on and off of the transistor T1 in synchronism with the pulsed input. As a result the loop L5 is periodically made and broken. When the connection between the ends of the loop L5 is made, as is the case with the loop L3, the loop L5 functions as a Faraday screen to inhibit inductive linking of the target inductance L4 with the inductance L1 of the main LC oscillator circuit of the proximity switch 31.

A remote control transmitter 34, which conveniently comprises a Plessey MV500 marketed by Plessey Semiconductors, is incorporated in the target and used as an encoder. It is operable to transmit a selected one of a number of coded pulsed signals and it is set to transmit a selected one of those coded pulsed signals before the target is put into service. The output of the transmitter 34 is connected to the base of the transistor T1.

The transmitter 34 has a power input port which is designed to be connected to a low voltage DC power source whereby the transmitter 34 is energised.

The output of the main LC oscillator circuit 33 is connected, via a rectifier circuit 35 and a threshold detector circuit 36, to a solid state switching circuit 37 which has outputs Q and $\overline{Q}$. It will be understood that the switching circuit 37 is arranged so that the output Q is high when the output $\overline{Q}$ is low and vice versa and to switch those two outputs from one state to the other when the threshold detector circuit 36 detects a change in the level of the rectified output of the main LC oscillator circuit 33. The Q output is open circuit and can be ignored.

The $\overline{Q}$ output is connected in parallel to a recognition, latch and timer circuit 38, to a remote control receiver 39 and to the collector of a transistor T2 which controls the main output signal from the proximity switch 31. The receiver 39 conveniently is a Plessey MV601 marketed by Plessey Semiconductors.

The output of the remote control receiver 39 is connected via a latch circuit 41 to an input of a clock oscillator circuit 42. The output of the clock oscillator circuit 42 is the pulsed input I which is supplied to the MOSFET S1. The output of the latch circuit 41 is also connected to the base of the main output transistor switch T2.

The output of the recognition latch and timer circuit 38 is connected to the base of a transistor switch T3 which has its collector earthed and its emitter connected to a second LC oscillator circuit 43.

The inductance L6 of the parallel resonant circuit L6, C6 of the second LC oscillator circuit 43 is positioned so as to be mutually inductively linked with an inductance L7 of a further LC resonant circuit L7, C7 which is mounted in the target 32, when the target 32 is in proximity with the proximity switch 31. The output of the LC resonant circuit L7, C7 is rectified by a rectifier circuit 44 and fed to the power input port of the remote control transmitter 34.

When the critical resonant frequency of the main LC oscillator circuit 33 of the proximity switch 31 is first lowered by the effect of the passive LC resonant circuit L4, C4 in the target 32, as that target 32 is brought into close proximity with the proximity switch 31, the resultant change in the output $\overline{Q}$ is transmitted to the recognition latch and timer circuit 38, to the remote control receiver 39, and to the collector of the transistor switch T2. As it would be a steady state output and as the receiver 39 would have been programmed to be activated by receipt of a signal which changes state sequentially in synchronism with the preselected coded pulsed signal that the transmitter 34 had been set to transmit, the receiver 39 does not respond to that output at $\overline{Q}$. The transistor switch T2 would be open circuit in the absence of any such response from the receiver 39. On the outer hand, the recognition latch and timer circuit 38 recognises the change of state of the output $\overline{Q}$ that accompanies the lowering of the critical resonant frequency of the main oscillator circuit, admits an output in reaction and latches that output as a steady state output so that it continues regardless of any subsequent change of state at the output $\overline{Q}$ until the end of a time interval determined by a timer circuit element of the recognition latch and timer circuit 38, whereafter the output from the circuit 38 is switched off.

No pulsed output I is emitted by the clock oscillator circuit 42 in the absence of any response by the receiver 39 to the output $\overline{Q}$.

The output from the recognition latch and timer circuit 38 effects switching on by the transistor T3 of the second LC oscillator circuit 43. The inductance L7 of the further parallel resonant circuit L7, C7 in the target 32, which would be sympathetically tuned with the second LC oscillator 43, would be mutually inductively linked with the inductance L6 of the second LC oscillator 43. Thus there would be a transmission of energy from the second LC oscillator circuit 43 in the proximity switch 31 to the further LC resonant circuit in the target 32, that energy being transmitted, in the form of a rectified output of the further parallel resonant circuit L7, C7, to the power input port of the transmitter 34 whereby to enable the latter to transmit its coded pulsed signal to the transistor T1. Hence the connection between the ends of the loop L5 will be made and broken sequentially in synchronism with the coded pulsed signal transmitted by the transmitter 34. The resultant periodic functioning of the loop L5 as a Faraday shield between the main LC oscillator 33 of the proximity switch 31 and the passive parallel resonant circuit L4, C4 of the target 32 results in the voltage of the main LC oscillator 33 being raised and lowered sequentially in sequence with the coded pulsed signal transmitted by the transmitter 34 to the bistate switch T1. That change of state of the LC oscillator 33 in synchronism with that coded pulsed signal will cause sequential changes of state of the output $\overline{Q}$ which will be transmitted to the receiver 39. It will be recognised by the receiver 39 as being in synchronism with the coded pulsed signal transmitted by the transmitter 34 to the bistate switch T1 whereupon the receiver 39 will emit an output. It follows that the receiver 39 monitors the state of the main LC oscillator circuit 33 and verifies that the state of that circuit changes in synchronism with the pre-selected coded pulsed signal transmitted by the transmitter 34.

The output from the receiver 39 is transmitted to the latch circuit 41 whereby it is latched at that level so that it would not change with subsequent changes in the state of the output $\overline{Q}$ and the latched signal is transmitted to both the clock oscillator 42 and the base of the output transistor T2. As a result the clock oscillator 42 is energised to emit the pulsed input I to the MOSFET S1 to enable operation of the proximity switch 31 substantially as described above with reference to FIG. 1, the output from the main LC oscillator 33 which is in synchronism with the pulsed input I being transmitted via the rectifier 35, the threshold detector 36, the solid state switching circuit 37 and the $\overline{Q}$ output and the output transistor T2 as the output of the proximity switch 31.

It will be understood that the time interval determined by the timer element of the recognition latch and timer circuit 38 is of sufficient duration to allow verification of the changes of state of the main LC oscillator circuit 33 in synchronism with the coded pulsed signal transmitted by the transmitter 34. In practice that time would be sufficient to allow the receiver 39 to receive at least two of the coded pulsed signals in sequence before it verifies them and issues its output to initiate operation of the clock oscillator circuit 42. On the other hand should the time interval lapse without the receiver 39 verifying the changes of state of the main oscillator circuit 31 so that the output of the recognition latch and timer circuit 38 is switched off without the clock oscillator circuit 42 having been switched on to transmit the pulsed output I to the MOSFET S1, the system will be closed down without the proximity switch 31 emitting any output since transmission of power from the proximity switch 31 to the target 32 to energise the transmitter 34 would also have been disenabled after the elapse of the time interval.

In the absence of any change in the physical relationship between the proximity switch 31 and the target 32, the functional range between the two typically being of the order of 0–8 mm, the proximity switch 31 will continue to function to emit an output through the transistor T2 until the system is switched off. On the other hand it will cease to operate immediately the target 32 is moved out of range. In the event that the system closed down at the end of the time interval determined by the timer element of the recognition latch and timer circuit 38 without the receiver 39 emitting an output after having verified that the changes of state of the main LC oscillator circuit 33 were in synchronism with the coded pulsed signal transmitted to the transistor T1 by the transmitter 34, it will be necessary to move the target 32 out of range of the proximity switch 31 and then to freshly bring it back into range in order to re-initiate the handshaking sequence.

I claim:

1. A combination comprising an inductive type proximity switch which comprises a main LC oscillator circuit, and a target which comprises inductance means, there being means provided which are adapted to be operated by a pulsed input, characterised in that one of the proximity switch and the target includes an open ended loop and said means adapted to be operated by a pulsed input comprise bistate switching means which are connected between the ends of the loop, the bistate switching means being adapted to be operated by the pulsed input to sequentially make and break a connection between the ends of the loop whereby the loop functions as a shield to inhibit mutual inductive linking of the inductance means of the target with inductance means of the main LC oscillator when the target is in proximity with the proximity switch and said connection is made.

2. A combination according to claim 1, wherein the open ended loop and bistate switching means are included in the proximity switch.

3. An inductive type proximity switch comprising a main LC oscillator circuit and means which are adapted to be operated by a pulsed input, characterised in that said means comprise bistate switching means and said proximity switch also comprises an open-ended loop, said bistate switching means being connected between the ends of the loop and being adapted to be operated by the pulsed input to sequentially make and break a connection between the ends of the loop whereby the loop functions as a shield to inhibit mutual inductive linking of a passive parallel resonant circuit of a target with inductance means of the main LC oscillator when the target is in proximity with the proximity switch and said connection is made.

4. An inductive type proximity switch as claimed in claim 3, wherein the inductance means of the main LC oscillator circuit and the open ended loop are formed on surfaces of a stack of printed circuit boards.

5. An inductive type proximity switch as claimed in claim 4 wherein the inductance means of the main LC oscillator circuit comprises interconnected pancake coils formed at least on opposite sides of one printed circuit board.

6. An inductive type proximity switch as claimed in claim 5, wherein, dependent upon the number of turns required for the coil of the inductance means, the interconnected pancake coils are also formed on one or more other surfaces of other printed circuit boards.

7. An inductive type proximity switch as claimed in claim 4, wherein the open-ended loop is formed as a single turn on a surface of a certain printed circuit board which has a feedback coil of the main LC oscillator circuit formed as a pancake coil on its other surface, and which is positioned at one end of the stack, so that the open-ended loop functions as a Faraday screen which is in the optimum location with respect to the feed back coil and the inductance means to which it is connected whereby approach of the target to that end of the stack can be distinguished from approach of the target from some other direction.

8. An inductive type proximity switch as claimed in claim 4, wherein the remaining components of the proximity switch are located on one or another of the stack of boards.

9. A combination according to claim 1, provided with handshaking means which comprise, in the target, another open-ended loop with respective bistate switching means operable to make and break a connection between the ends of the other open-ended loop, and means operable to transmit a pre-selected coded pulsed signal to said respective bistate switching means whereby the connection between the ends of said other open-ended loop is made and broken sequentially in synchronism with said pre-selected coded pulsed signal so that, when the target is in proximity with the proximity switch and said pre-selected coded pulsed signal is transmitted to said respective bistate switching means, said other loop functions as a shield to inhibit mutual inductive linking of said inductance means of the target with said inductance means of the main LC oscillator circuit when the connection between its ends is made, whereby the main LC oscillator circuit changes between its active and quiescent states in synchronism with said pre-selected coded pulsed signal, said handshaking means also comprising means operable to monitor the state of the main LC oscillator circuit whereby to verify that it changes between its active and quiescent states in synchronism with said pre-selected coded pulsed signal, and operable to enable the pulsed input to the bistate switching means connected between the ends of the open-ended loop of the proximity switch, said pulsed input being disenabled until the changes of state of the main LC oscillator are so verified.

10. A combination according to claim 9, wherein said handshaking means further include means operable to disenable said means operable to transmit a pre-selected coded pulsed signal when said pre-selected coded pulsed signal has been transmitted for a certain time interval.

11. A combination according to claim 9, including means whereby said means operable to transmit said pre-selected coded pulsed signal are enabled by the initial change of state of the main LC oscillator circuit to its active state when the target is in proximity with it.

12. A combination according to claim 11, wherein said means whereby said means operable to transmit said pre-selected coded pulsed signal are enabled comprise another LC oscillator circuit in said proximity switch, means responsive to the state of said main LC oscillator circuit which are operable to switch the other LC oscillator circuit to its active state when the main LC oscillator circuit is initially switched to its active state by the proximity of the target, and, in the target, a further parallel resonant circuit which is mutually inductively linked with inductance means of said other LC oscillator circuit when the target is in proximity with the proximity switch, said further parallel resonant circuit being connected via rectifier means to said means operable to transmit a pre-selected coded pulsed signal whereby to energise the latter means.

13. A target for use in combination with an inductive type proximity switch, which target comprises inductance means, there being means adapted to be operated by a pulsed input, characterised in that said means adapted to be operated by a pulsed input comprise bistate switching means, and said target further comprises an open ended loop, said bistate switching means being connected between the ends of the loop and being adapted to be operated by the pulsed input to sequentially make and break a connection between the ends of the loop whereby the loop functions as a shield to inhibit mutual inductive linking of the inductance means of the target with inductance means of a main LC oscillator of the proximity switch when the target is in proximity with the proximity switch and said connection is made.

14. A target according to claim 13, including means operable to transmit a pre-selcted coded pulsed signal to said bistate switching means or to other bistate switching means connected between the ends of another open-ended loop, said other bistate switching means being operable to make and break a connection between the ends of the other open-ended loop, the arrangement being such that the connection between the ends of the open-ended loop to which said coded pulsed signal is transmitted is made and broken sequentially in synchronism with said pre-selected coded pulsed signal so that, when the target is in proximity with the proximity switch and said pre-selected coded pulsed signal is transmitted, the main LC oscillator circuit of the proximity switch changes state between its active and quiescent states in synchronism with said pre-selected coded pulsed signal.

15. A target according to claim 14, including a passive LC resonant circuit which is connected by rectifier means with a power input port of said means operable to transmit said pre-selected coded pulsed signal, said passive LC resonant circuit being for mutual inductive linking with inductance means of another LC oscillator circuit in the proximity switch when the target is in proximity with the proximity switch so that said means operable to transmit said pre-selected coded pulsed signal is energised by said passive LC resonant circuit when the latter is changed to its active state by being mutually inductively linked with said other LC oscillator circuit in the proximity switch when the target is in proximity with the proximity switch.

16. A combination as claimed in claim 2, wherein the inductance means of the main LC oscillator circuit and the open-ended loop are formed on surfaces of a stack of printed circuit boards.

* * * * *